United States Patent [19]
Gal et al.

[11] Patent Number: 5,480,764
[45] Date of Patent: Jan. 2, 1996

[54] GRAY SCALE MICROFABRICATION FOR INTEGRATED OPTICAL DEVICES

[75] Inventors: George Gal, Palo Alto; William W. Anderson, Half Moon Bay; Bruce J. Herman, Mountain View; Marc A. Stiller, Boulder Creek, all of Calif.

[73] Assignee: Lockheed Missiles and Space Comapny, Inc., Sunnyvale, Calif.

[21] Appl. No.: 206,134

[22] Filed: Mar. 4, 1994

Related U.S. Application Data

[63] Continuation-in-part of Ser. No. 982,514, Nov. 27, 1992, Pat. No. 5,310,623.

[51] Int. Cl.⁶ .................................................. G02B 6/136
[52] U.S. Cl. ........................... 430/321; 345/14; 345/129; 345/132; 216/24
[58] Field of Search ....................... 430/321, 5; 385/129, 385/132, 14; 156/643, 659.1; 216/24

[56] References Cited

U.S. PATENT DOCUMENTS

| | | | |
|---|---|---|---|
| 3,932,184 | 1/1976 | Cohen et al. | 96/38.3 |
| 4,200,794 | 4/1980 | Newberry et al. | 250/396 |
| 4,279,690 | 7/1981 | Dierschke | 156/649 |
| 4,421,398 | 12/1983 | Suzuki et al. | 354/200 |
| 4,427,265 | 1/1984 | Suzuki et al. | 350/321 |
| 4,691,993 | 9/1987 | Porter et al. | 350/205 |
| 4,775,967 | 10/1988 | Shimada et al. | 369/45 |
| 4,861,140 | 8/1989 | Lucitte et al. | 350/320 |
| 4,877,717 | 10/1989 | Suzuki et al. | 430/321 |
| 4,902,899 | 2/1990 | Lin et al. | 250/492.1 |
| 4,983,040 | 1/1991 | Chu et al. | 356/338 |
| 4,986,633 | 1/1991 | Ohta | 350/167 |
| 5,135,609 | 8/1992 | Pease et al. | 156/654 |
| 5,136,164 | 8/1992 | Hendrick | 250/353 |
| 5,139,609 | 8/1992 | Fields et al. | 156/643 |
| 5,213,916 | 5/1993 | Cronin et al. | 430/5 |
| 5,273,622 | 12/1993 | Jacobsen et al. | 156/659 |
| 5,281,305 | 1/1994 | Lee et al. | 156/657 |

FOREIGN PATENT DOCUMENTS

| | | |
|---|---|---|
| 0532040 | 3/1993 | European Pat. Off. . |
| 55-065910 | 5/1980 | Japan .................. 385/132 |
| 61-113062 | 5/1986 | Japan . |
| 3191348 | 8/1991 | Japan . |
| 2179472 | 3/1987 | United Kingdom . |
| 8906596 | 7/1989 | WIPO . |
| 9102380 | 2/1991 | WIPO . |

OTHER PUBLICATIONS

William Goltsos & Michael Holz "Agile Beam Steering Using Binary Optics Microlens Arrays", Nov. 1990 *Optical Engineering*, vol. 29, No. 11.

G. Artzner "Aspherical surfaces engraved on photoresist coatings: manufacture of a zonal corrector plate for an aberrating cassegrainian telescope", 1987, *Optical Componentsand Systems*, SPIE vol. 805.

E. Hausmann & E. P. Slack Physics, (3rd Edition, 1948) pp. 727–728.

Osamu Wada, "Ion–Beam Etching of InP and Its Application to the Fabrication of High Radiance InGaAsP/InP Light Emitting Diodes"—vol. 131, No. 10, pp. 2373–2379—*J. Electrochem Soc.: Solid–State Science & Technology*.

*Primary Examiner*—Charles L. Bowers, Jr.
*Assistant Examiner*—John A. McPherson
*Attorney, Agent, or Firm*—Feix & Feix; H. Donald Volk

[57] ABSTRACT

A monolithically integrated, micro-fabricated optical device for use in photonic applications has at least one waveguide surface configuration which cannot be fabricated by binary processing. The optical device comprises a plurality of layers of substrate materials. The material in at least one layer has an index of refraction different from the index of retraction of the material in an adjacent layer. A waveguide surface is formed at an interface between the layers and has a configuration fabricated by use of a gray scale mask.

13 Claims, 10 Drawing Sheets

FIG_1

LIGHT EXPOSURE
GRAYSCALE MASK
PHOTO RESIST
SUBSTRATE N1

FIG_2

CHEMICAL DEVELOPER
DEVELOPED PHOTO RESIST MATERIAL
SUBSTRATE N1

FIG_3

DEVELOPED IMAGE IN N1 SUBSTRATE

FIG_4

FIG_5

FIG_6

FIG_7

FIG_7A

FIG_9

FIG_10

FIG_16

FIG_17

FIG_18

FIG_19

FIG_20

FIG_21

FIG_22

FIG_23

FIG_24

FIG_25

FIG_26

FIG_27

FIG_34  FIG_35

FIG_36  FIG_37

FIG_38  FIG_39

FIG_40

PHOTO RESIST MATERIAL

FIG_41

FIG_42

FIG_43

GRAY SCALE MICROFABRICATION FOR INTEGRATED OPTICAL DEVICES

CROSS REFERENCES TO RELATED U.S. APPLICATIONS

This application is a continuation-in-part of U.S. patent application Ser. No. 07/982,514 filed Nov. 27, 1992, now U.S. Pat. No. 5,310,623 and entitled "Method for Fabricating Microlenses", George Gal, inventor, and assigned to the same assignee as the assignee of this application.

This application claims the benefit of the Nov. 27, 1992 filing date for the subject matter which is common to the parent application Ser. No. 07/982,514, now U.S. Pat. No. 5,310,623.

BACKGROUND OF THE INVENTION

The parent application Ser. No. 07/982,514 filed Nov. 27, 1992, now U.S. Pat. No. 5,310,623 (referred to above) discloses methods and apparatus for fabricating microlenses. A single exposure mask is used to produce a replica of a designed microlens in a photoresist material. The replica is then used to produce the designed microlens in a substrate material.

The method and apparatus disclosed in parent application Ser. No. 07/982,514 filed Nov. 27, 1992, now U.S. Pat. No. 5,310,623, enables a microlens of any configuration to be designed and fabricated.

The design, for example, can be generated by a computer using a three dimensional modeling program. In that event, the modeled microlens is contained within a three dimensional plot having x, y and z coordinates, as illustrated in FIG. 7 of the parent application. The x and y coordinates are divided by lines into a plurality of equal size increments (40 increments of 2.0 micrometers in each coordinate direction in one specific embodiment illustrated in FIG. 7 of the application) so that the lines form a fine grid for locating precise points on the surface of the microlens and for indicating the height (thickness) of the microlens at each precise point.

In the embodiment of the invention shown in FIG. 7–13 of the parent application, the microlens was formed within a single pixel 53. Each pixel 53 was subdivided into sub pixels 55. Each sub pixel was one segment in a rotational symmetry and was divided into gray scale resolution elements 57. In a specific embodiment of the invention disclosed in the parent application, the pixel was 80 micrometers on each side, each sub pixel was two micrometers on each side, and each gray scale resolution element 57 was 0.2 micrometers on each side. The exposing light was ultraviolet light of 0.3 micrometers wavelength.

By using an appropriate mask opening transmission pattern (as shown in FIG. 12 of the parent application), an exposure and a photoresist material could be created which would cause the height of the processed photoresist material to replicate the exact height of the designed microlens. The exposed photoresist material was then processed, using known photoresist processing, to produce in the photoresist material a replica of the desired microlens.

This replica was then used subsequently for producing the desired microlens in a substrate material with the application of known differential ion milling technology.

The present invention utilizes the method and apparatus fabrication features disclosed in parent application Ser. No. 07/982,514, now U.S. Pat. No. 5,310,623, for micro-fabrication of integrated optical devices.

The present invention is particularly directed to methods and apparatus for fabricating within a volume of a photoresist material a replica of a photonic waveguide surface of any designed configuration, using a single exposure mask, and then reproducing the replica directly in a substrate material for ultimate use in photonic applications.

The present invention monolithically integrates selected substrate layers, with certain substrate layers incorporating a specifically designed photonic waveguide surface configuration within the substrate layer.

In some embodiments of the present invention photonic waveguide surface configurations within certain substrate layers (aligned or offset) are constructed to coact with one another in the transmission of photonic electro-optic waves through the substrate layers.

SUMMARY OF THE INVENTION

This application is directed to methods and apparatus for fabricating within a volume of a photoresist material a replica of a photonic waveguide surface of any designed configuration, using a single exposure mask, and reproducing the replica directly in a substrate material for ultimate use in photonic applications.

In the method and apparatus of the present invention a single exposure mask is constructed with a plurality of precisely located and sized light transmitting openings formed with sufficiently small opening sizes and located at a sufficiently large number of specific locations, correlated to related locations on the configuration of the photonic waveguide surface, to enable a replica image of said surface to be produced within a volume of the photoresist material.

The photoresist material is exposed to light of a selected wavelength aria transmitted through said openings in said single mask for a selected duration of time.

The exposed photoresist material is processed to produce a replica within the photoresist material of said photonic waveguide surface, which replica can be used subsequently for producing said surface in a substrate material.

The photoresist material replica is placed on a first substrate material having a first index of refraction, and the replica and the first substrate material are processed to reproduce the replica directly within the substrate material and to remove the volume of the first substrate material which is bounded by the replicated surface produced in the first substrate.

The removed volume is filled with a second substrate material having a second index of refraction different from the first index of retraction of the first substrate material so that the two substrate materials and the constructed photonic waveguide surface can ultimately be used in photonic applications.

In the method and apparatus of the present invention selected substrate layers are monolithically integrated. Certain substrate layers incorporate a specifically designed photonic waveguide surface configuration within the substrate layer.

In some embodiments of the invention the photonic waveguide surface configurations in substrate layers (aligned or offset) are constructed to coact with one another in the transmission of photonic electro-optic waves through the substrate layers.

The applications of the present invention include channel sidewall configurations which will accommodate selected optical modes of the optical field; mirrors (planar or curved); beam splitters; lenses; and controls.

The functions which can be performed include optical coupling, optical distributions, optical routing and splitting, optical vias and any function which is dependent on being able to control, in a three dimensional way, dielectric or optical waveguide patterns.

Methods and apparatus which incorporate the features described above and which are effective to function as described above constitute specific objects of the invention.

Other and further objects of the present invention will be apparent from the following description and claims and are illustrated in the accompanying drawings, which by way of illustration, show preferred embodiments of the present invention and the principles thereof and what are now considered to be the best modes contemplated for applying these principles. Other embodiments of the invention embodying the same or equivalent principles may be used and structural changes may be made as desired by those skilled in the art without departing from the present invention and the purview of the appended claims.

BRIEF DESCRIPTION OF THE DRAWING VIEWS

FIGS. 1–3 correspond to respective FIGS. 17–19 of parent application Ser. No. 07/982,514 filed Nov. 27, 1992, now U.S. Pat. No. 5,310,623; and FIGS. 4 and 5 correspond to respective FIGS. 15 and 16 of parent application Ser. No. 07/982,514, now U.S. Pat. No. 5,310,623.

Applicants are repeating and incorporating in this continuation-in-part application all of the earlier parent application Ser. No. 07/982,514 filed Nov. 27, 1992, now U.S. Pat. No. 5,310,623; but, to avoid making the drawings and descriptions of this application unnecessarily bulky, applicants are showing in the drawing views of this application only five drawing figures (FIGS. 1–5) which correspond to respective drawing views 17–19 and 15–16 of parent application Ser. No. 07/982,514, now U.S. Pat. No. 5,310,623.

FIG. 4 of this application corresponds to FIG. 15 of the parent application. FIG. 4 also shows how a sub pixel is comprised of a gray scale resolution provided by the number of resolution elements contained within the size of the exposure opening in the particular sub pixel.

FIG. 5 is identical to FIG. 16 of the parent application. FIG. 16 is a curve showing how the size of the opening in the sub pixel is calibrated with respect to process parameters. The process parameters may include variations in the exposure time, the wavelength of the exposing light and the characteristics of the photoresist material. The calibration helps to insure that the size of the exposure opening in each sub pixel transmits enough light intensity to produce the desired replication (first in the photoresist material and ultimately in the substrate material) of the height of the designed microlens at the location corresponding to that particular pixel.

FIG. 6 is an isometric view of an integrated optical device constructed in accordance with one embodiment of the present invention. In the FIG. 6 embodiment an intermediate connector component incorporates a cone shaped, tapered transmission line to transmit light efficiently from a fiber optic into a waveguide channel of a photonic device. The dimensions of the fiber optic and the waveguide channel are mis-matched. The curved surface of the tapered transmission line efficiently accommodates the optical modes of the optical field and very efficiently couples the energy from the larger diameter, circular cross section fiber to the smaller diameter, rectangular cross section waveguide.

FIGS. 11–13 show how the second substrate layer N2 is formed to provide the upper surface of the cone shaped, tapered transmission line.

FIGS. 15–17 show first how a single gray scale mask is used to form a replica of a waveguide channel and an inclined surface in a photoresist material and how the photoresist material replica is then produced in a substrate N1.

A gray scale mask is indicated in FIG. 15 for forming the flat rectangular shaped waveguide 123 (see FIG. 17) in the substrate layer 135. It should be noted, at this point, that a gray scale mask is required (for such flat, constant depth, bottom wall and flat, vertical, side wall surfaces of the rectangular shaped waveguide) only when the surfaces are not aligned in a crystal direction. If such flat surfaces are aligned in a crystal direction, the rectangular waveguide surfaces can be fabricated with a binary mask. A gray scale mask is required to fabricate the inclined surface to be used (see FIG. 17) as a reflective surface for an out of plane mirror. It should be noted also that differential ion milling is required only when a gray scale mask is required. Ion milling, rather than differential ion milling, can be used where a binary mask can be used.

FIGS. 28 and 29 also show how certain substrate layers can incorporate a specifically designed photonic waveguide surface configuration within the substrate layer. FIGS. 28 and 29 also show how specific photonic waveguide surface configurations in different substrate layers can coact with one another in the transmission of photonic electro-optic waves through the different substrate layers.

Both FIGS. 28 and 29 show waveguide channels which are filled with a substrate N2 and which are axially offset with respect to one another.

In FIG. 28 the end surfaces of the waveguide channels are formed with lens elements which couple the wave energy from one waveguide channel to the other. In FIG. 28 control elements (electrodes) are also associated with one waveguide channel for controlling the flow of wave energy through the channels.

In the FIG. 29 embodiment one waveguide channel is formed with a lens and the other waveguide channel is formed with a reflective mirror.

DETAILED DESCRIPTION OF THE PREFERRED EMBODIMENTS

As described above in the text of this application under the subtitle "Background of the Invention" and under the subtitle "Brief Description of the Drawing Views", the microfabrication methods and apparatus of the present invention utilize, as a starting point, the gray scale fabrication methods and apparatus disclosed in parent application Ser. No. 07/982,541 filed Nov. 27, 1992, now U.S. Pat. No. 5,310,623.

In the present invention a gray scale mask is used to produce a replica of the desired structure in a photoresist material, and the photoresist replica is then transferred to a substrate material.

The gray scale resolution elements of the mask have sub micron dimensions on each side. The light transmitting openings in the mask can produce a controlled exposure of a photoresist.

In the fabrication of a microlens this finely detailed and precisely constructed mask structure enabled a very accurate replica of a microlens, having any designed surface, to be produced in a photoresist material. The photoresist replica of the microlens was then placed on a substrate material, and the replica and substrate were processed to produce the designed microlens in the substrate.

This fabrication method and apparatus are effective to produce a highly accurate surface configuration design in a substrate. The produced item can be fabricated to have relatively smooth, continuous surface curvatures and/or a step.

Applicants are repeating and incorporating in this continuation-in-part application all of the parent application Ser. No. 07/982,514 filed Nov. 27, 1992, now U.S. Pat. No. 5,310,623. To avoid making the drawings and description of this application unnecessarily bulky, applicants are physically including in the drawing views of this application only five drawing figures (FIGS. 1–5) which correspond to respective drawing FIGS. 17–19 and 15–16 of the parent application Ser. No. 07/982,514, now U.S. Pat. No. 5,310,623.

Figure 1:
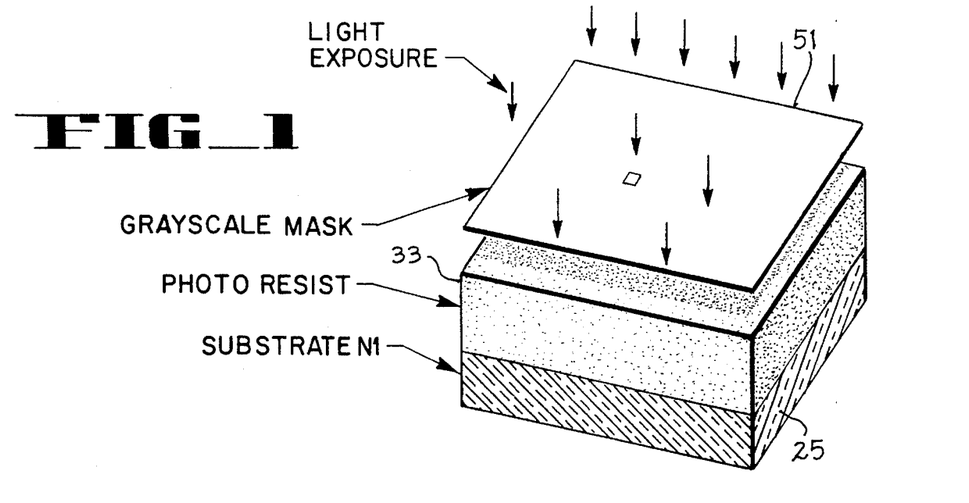
FIGS. 1–3 of this application are progressive views (like FIGS. 17, 18 and 19 of parent application Ser. No. 07/982,514, now U.S. Pat. No. 5,310,623) showing the stages, respectively, of (FIG. 1) exposure of the photoresist material through the openings in the single, gray scale exposure mask, (FIG. 2) replication of the designed microlens in the photoresist material following processing of the photoresist material after exposure, and (FIG. 3) processing (in this case differential ion milling) the photoresist material replica of the designed microlens into the substrate material to reproduce the replica directly into the substrate material.
Figure 2:
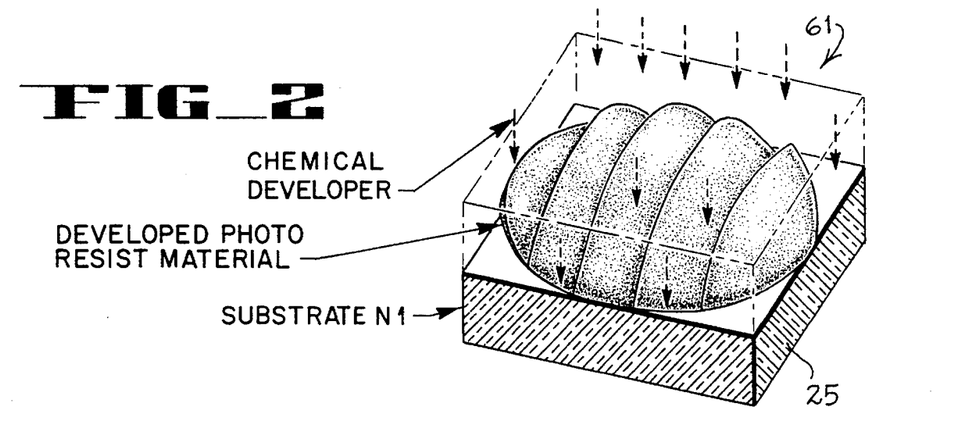
Figure 3:
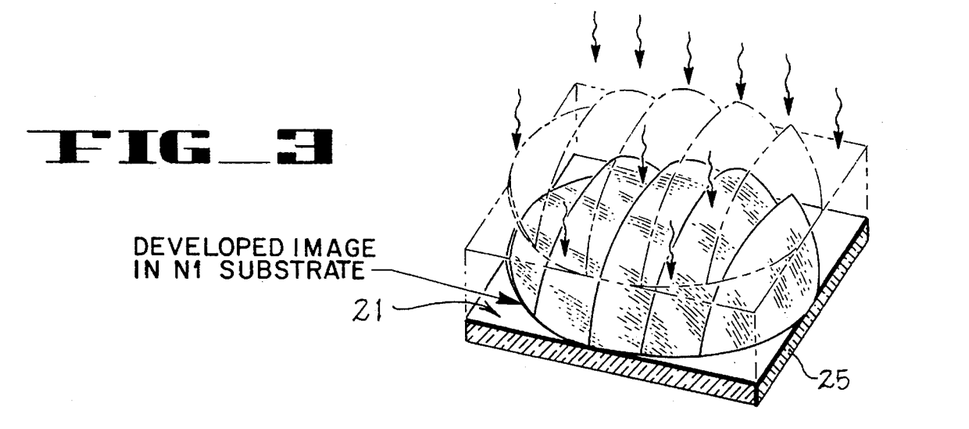

FIGS. 1–3 of this application are progressive views (like respective FIGS. 17, 18 and 19 of parent application Ser. No. 07/982,514, now U.S. Pat. No. 5,310,623) showing the sequence of (FIG. 1) exposure of the photoresist material through the openings in the single, gray scale exposure mask, (FIG. 2) replication of the designed microlens in the photoresist material following processing of the photoresist material after exposure, and (FIG. 3) processing (in this case differential ion milling) the photoresist material replica of the designed microlens into the substrate material to reproduce the replica directly into the substrate material.

Figure 4:
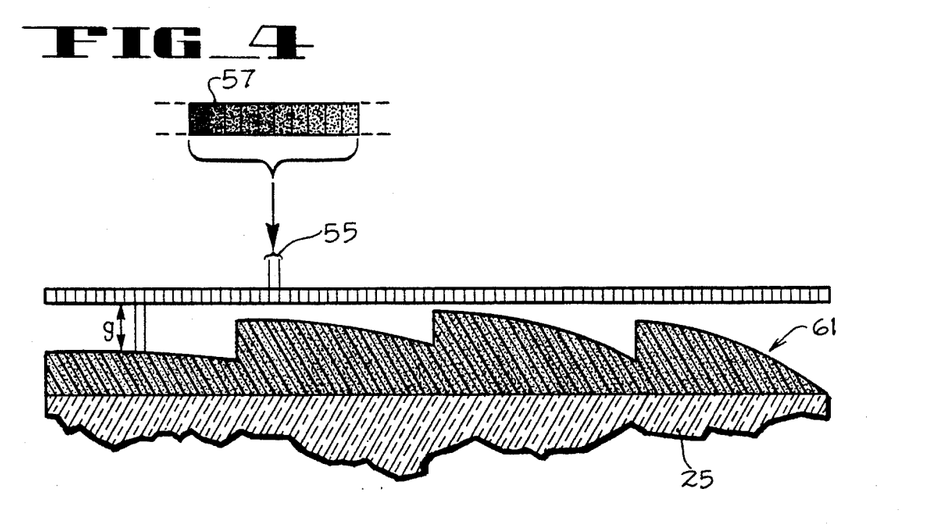
FIG. 4 is a fragmentary side elevation view, in cross section, showing how a replica of the designed microlens is formed in photoresist material at an intermediate stage of fabrication of a designed microlens in the substrate material.

FIG. 4 of this application corresponds to FIG. 15 of the parent application. FIG. 4 is a fragmentary side elevation view, in cross section, showing how a replica of the designed microlens is formed in photoresist material at an intermediate stage of fabrication of a designed microlens in the substrate material. FIG. 4 also shows how a sub pixel 55 is comprised of a gray scale resolution provided by the number of resolution elements 57 contained within the size of the exposure opening in the particular sub pixel.

In this specific embodiment the processed photoresist material starts at the interface between the substrate 25, and the thickness of the processed photoresist relates to the intensity of light transmitted to the photoresist material through the mask.

If a large amount of exposure light is transmitted through a particular mask opening to the photoresist material, then the upward extent of the processed photoresist is limited and the thickness of the replica is very thin.

If the amount of exposure light (transmitted through a particular mask opening in a particular sub-pixel) is small, then the height of the processed photoresist is large.

The amount of soluble photoresist material removed during processing from a particular sub-pixel area following exposure is indicated by the letter g in FIG. 15.

When the soluble material is removed, the replica 61 of the designed microlens is then formed in the remaining processed photoresist material as illustrated in FIG. 15.

Figure 5:
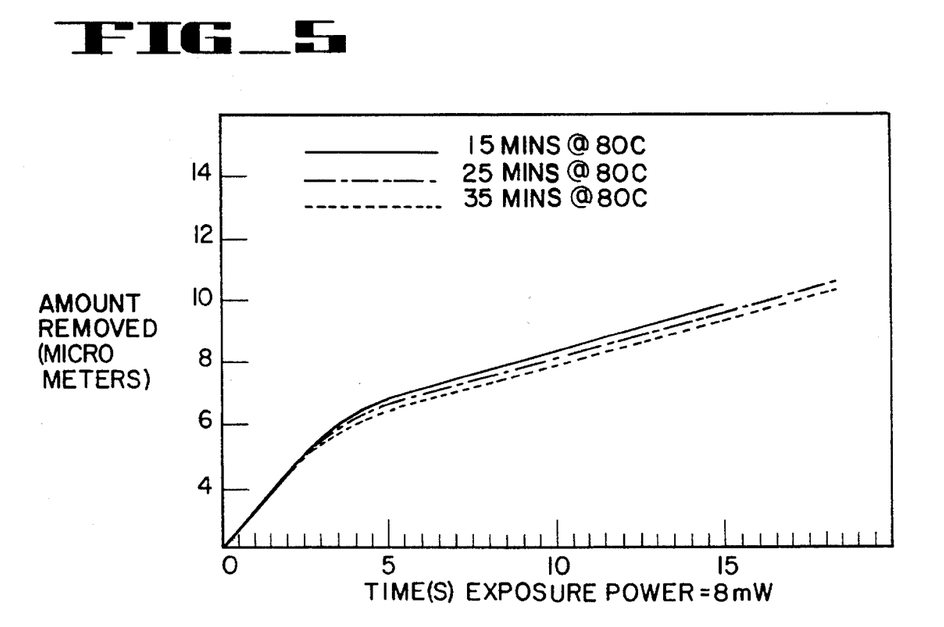

FIG. 5 is identical to FIG. 16 of the parent application. FIG. 5 is a curve showing how the size of the opening in the sub pixel is calibrated with respect to process parameters. The process parameters may include variations in the exposure time, the wavelength of the exposing light and the characteristics of the photoresist material. The calibration helps to insure that the size of the exposure opening in each sub pixel transmits enough light intensity to produce the desired replication (first in the photoresist material and ultimately in the substrate material) of the height of the designed curved surface at the location corresponding to that particular pixel.

The present invention utilizes these gray scale fabrication features (disclosed in parent application Ser. No. 07/982,514, now U.S. Pat. No. 5,310,623) as an initial sequence, or starting point, for the micro fabrication of integrated optical devices.

The present invention is particularly directed to methods and apparatus for fabricating within a volume of photoresist material a replica of a photonic waveguide surface of any designed configuration. A single exposure mask is used for one, specific surface configuration. The replica in the photoresist material is then produced in a substrate material for ultimate use in photonic applications.

The present invention monolithically integrates selected substrate layers. Certain ones of the substrate layers incorporate a specifically designed photonic waveguide surface configuration within the substrate layer.

In some embodiments of the present invention the photonic waveguide configurations within substrate layers (aligned or offset) are constructed to coact with one another in the transmission of electro-optical waves through the substrate layer.

Figures 6, 7A:
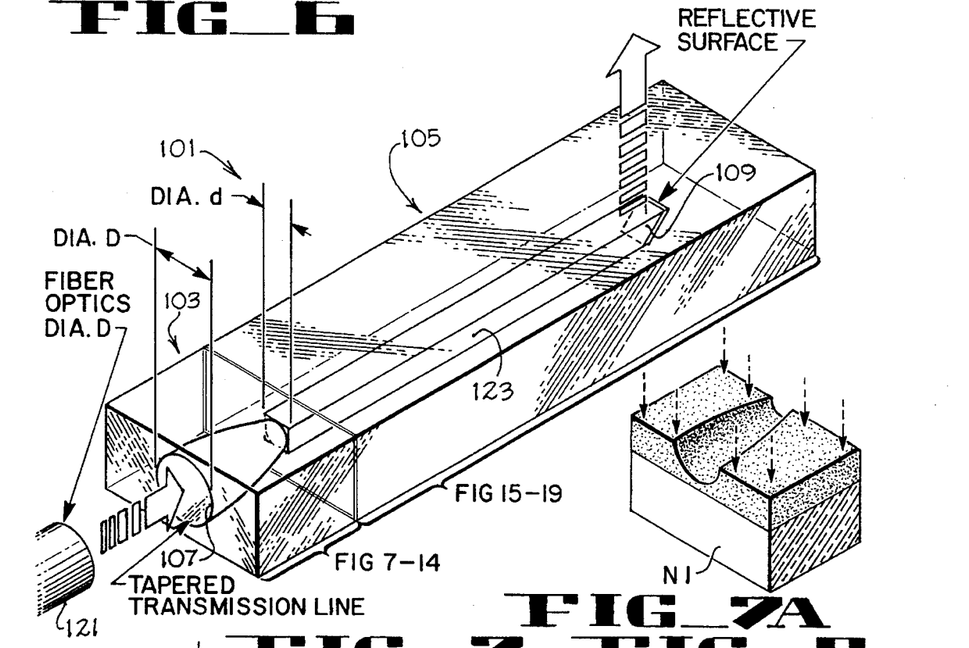

FIG. 6 shows an integrated optical device 101 constructed in accordance with one embodiment of the present invention.

The integrated optical device 101 shown in FIG. 6 incorporates two components 103 and 105.

The component 103 is an intermediate connector having a tapered transmission line 107. The construction and method of fabrication of this component 103 are shown in more detail in FIGS. 7–14.

The component 105 is a waveguide component formed with a reflective surface 109. The reflective surface functions as an out of plane mirror in a photonic application. The construction and method of fabrication of this waveguide component 105 are shown in detail in FIGS. 15–19.

Figure 22:
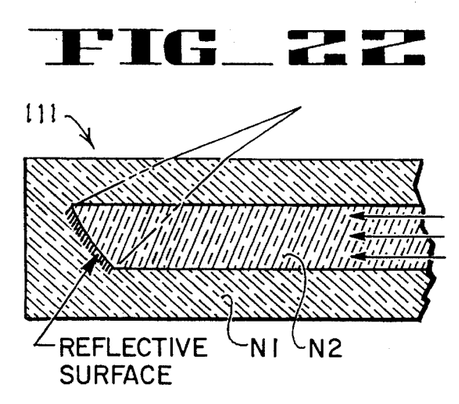
FIG. 22 is a cross section view showing how the reflective surface of a waveguide (like the reflective surface shown in FIG. 19) can be shaped to be a curved, reflective surface which will focus the wave energy transmitted through the substrate material N2.
Figure 23:
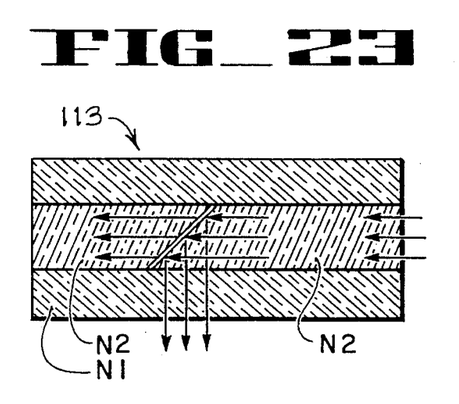
FIG. 23 shows a beam splitter construction in which a partially transmissive flat mirror is interposed in a waveguide channel filled with a substrate material N2.

FIGS. 22 and 23 show two additional embodiments 111 and 113 of the present invention.

The embodiment 113 shown in FIG. 23 functions as a beam splitter.

The structure and fabrication of the beam splitter embodiment 113 is shown in more detail in FIGS. 24–27.

Figure 28:
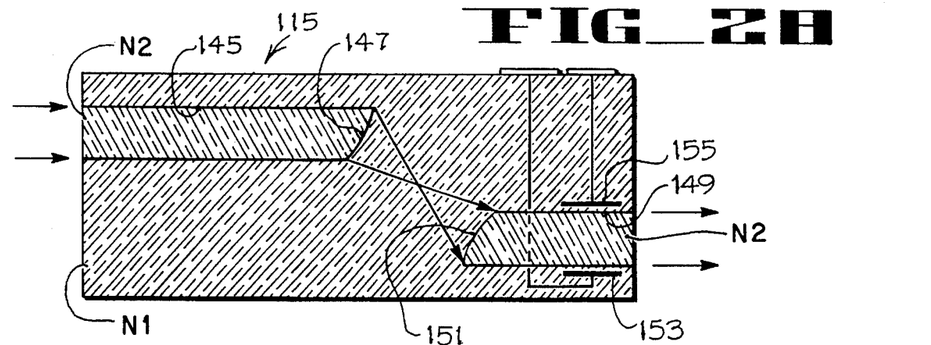
FIGS. 28 and 29 are cross section views showing how substrate layers are monolithically integrated.
Figure 29:
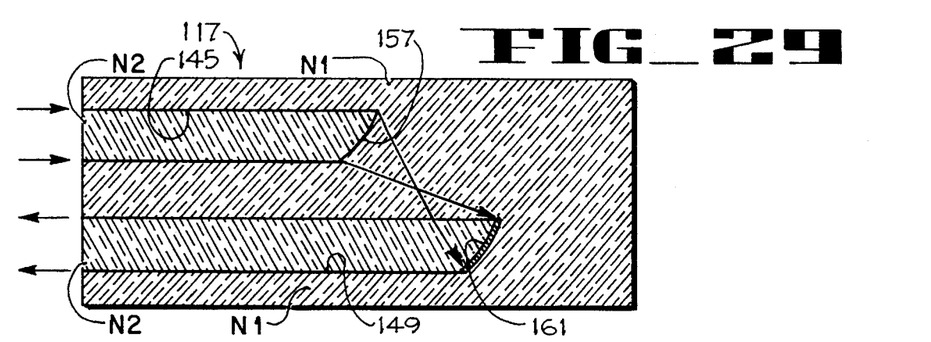
Figures 30, 31:
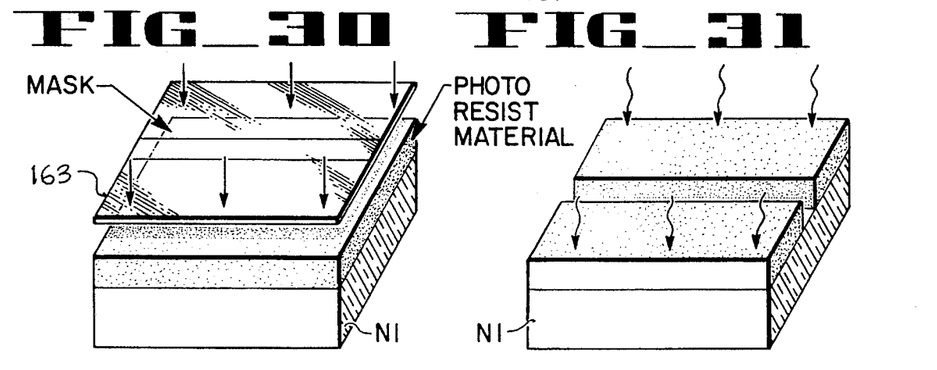
FIGS. 30–43 are progressive views showing various stages of fabrication of the monolithically integrated substrate layers of the microfabricated, integrated optical device illustrated in FIG. 28.
Figure 32:
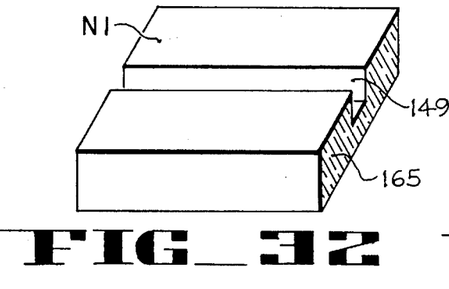

FIGS. 28 and 29 show two additional embodiments 115 and 117 of the present invention. These two embodiments of the present invention show how substrate layers are monolithically integrated and show how certain ones of the substrate layers incorporate a specifically designed photonic waveguide configuration within the substrate layer.

The embodiments 115 and 117 also show how photonic waveguide surface configurations in certain substrate layers are constructed to coact with one another in the transmission of photonic electro-optic waves through the substrate layers.

FIGS. 30–43 show details of the structure and method of fabrication of the embodiment 115 shown in FIG. 28.

Referring now to FIG. 6 the integrated optical device 101 illustrates how, in accordance with the present invention, it is possible to put light efficiently from a fiber into a photonic device where dimensions are mismatched.

As illustrated in FIG. 6, the fiber optic has a relatively large diameter D and has a circular cross section.

The waveguide 123 within the component 103 has a smaller diameter d and has a rectangular cross section.

It is possible, using the methods and apparatus of the present invention, to fabricate an intermediate connector 103 having a tapered transmission line 107 which efficiently accommodates the optical modes of the optical field and which couples the energy very efficiently from the larger diameter, circular cross section fiber to the smaller diameter, rectangular cross section waveguide.

The surface of the tapered transmission line 107 is a cone which can be mathematically defined as a function of x (the distance along the central axis of the cone). The interior of the tapered transmission line is filled with a substrate N2 (see FIGS. 13 and 14) having one index of refraction. The material surrounding the tapered transmission line 107 is a substrate N1 having an index of refraction different from the index of refraction of the substrate material N2.

The methods and structures used to fabricate the intermediate connector 103 will now be described with particular reference with FIGS. 7–14.

Figure 7:
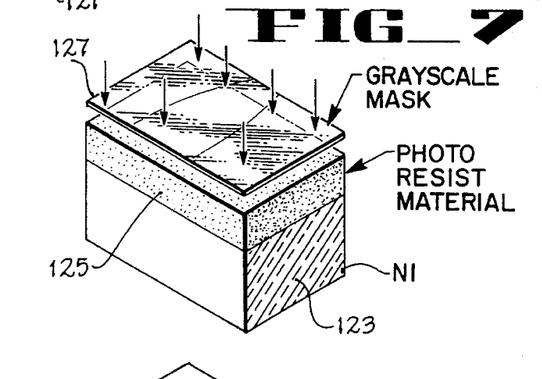
FIGS. 7–9 are progressive views showing how the lower half of the cone-shaped coupler surface is fabricated into a substrate layer N1.

As shown in FIG. 7 a first layer 123 of substrate N1 (which will form the lower half of the intermediate connector 103 shown in FIG. 6) is covered, on its upper surface, with a layer 125 of photoresist material.

A single exposure mask 127 is positioned above the layer photoresist material.

The single exposure mask 127 is constructed with a plurality of precisely located and sized light transmission openings (not shown in FIG. 7 because of the scale of the drawing but like the sub pixels 55 shown in FIG. 4). The openings are formed with sufficiently small specific opening sizes and are located at a sufficiently large number of specific locations (correlated to the related locations on the lower half of the tapered transmission line 107 opening ultimately to be carved out of the substrate layer 123) to enable a replica image of said conical surface to be produced within the volume of the layer 125 of the photoresist material. The layer 125 of photoresist is exposed to light of a selected wavelength (which in one embodiment of the invention is ultraviolet light) and transmitted through the openings in the mask 127 for a selected duration of time.

The exposed photoresist material 125 is then processed, by known photoresist material processing techniques, to produce the replica (within the photoresist material 125) of the lower half of the conical surface.

This replica is then used to produce the surface in the substrate material 123.

As shown in FIG. 7A, differential ion milling (represented by the dash line arrows in FIG. 7A) is used to reproduce the replica of the conical surface in the substrate material.

Figure 8:
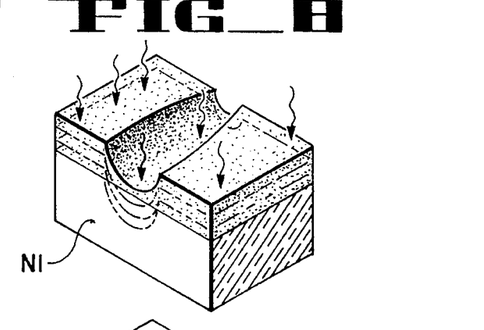

FIG. 8 is a view showing how the photoresist replica conical surface is progressively ion milled into the substrate layer 123.

Figure 9:
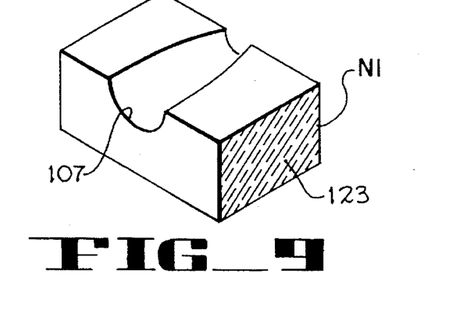

At the completion of the differential ion milling operation, the substrate layer 123 has a structure as shown in FIG. 9.

Figure 10:
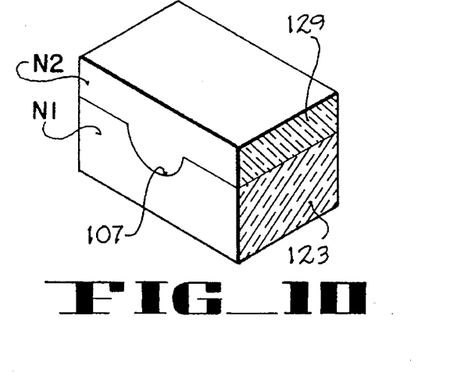
FIGS. 10–13 show how a second substrate layer N2, having an index of refraction different from the index of refraction of the substrate N1, fills the volume of the lower half of the cone shape surface which had been fabricated in the substrate layer N1.

The volume within the surface 107 is then filled with a substrate material N2.

The layer 129 of this substrate material N2 is made thick enough to permit the conical surface of the upper half of the tapered transmission line 107 to be formed on the substrate material N2.

Figure 11:
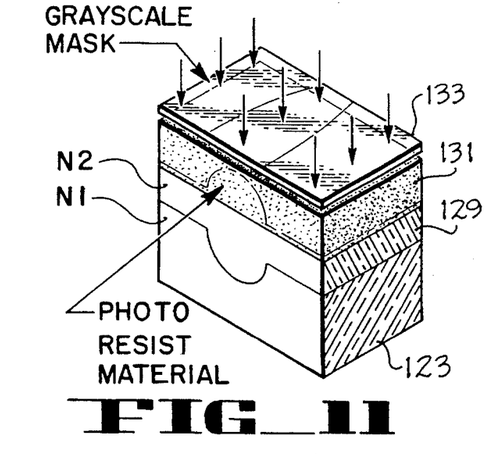

As illustrated in FIG. 11, a layer 131 of photoresist material is placed on top of the layer 129 of substrate N2, and a single exposure mask 133 is positioned above the layer 131 of photoresist material.

The exposure mask 133 is constructed to have a plurality of precisely located and sized light transmitting openings formed with sufficiently small specific opening sizes and located at a sufficiently large number of specific locations to enable a replica image of the top half of the conical, tapered transmission line surface to be produced in the volume of the photoresist layer 131.

Figure 12:
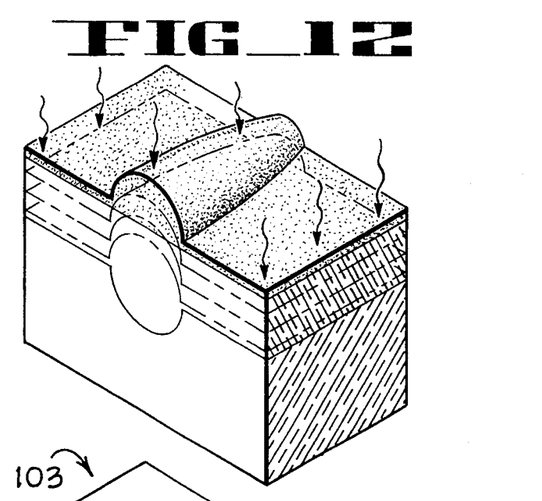

As illustrated in FIG. 12 this upper half of the curved surface is produced into the substrate N2 by differential ion milling (as indicated by the wavy lined arrows in FIG. 12 and as indicated by the progression of ion milling as shown in FIG. 12).

Figures 13, 14:
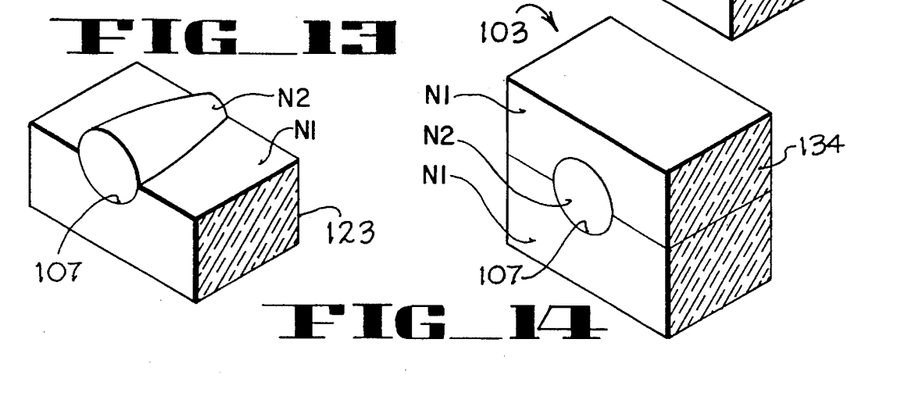
FIG. 14 shows how another, cladding layer of the substrate N1 is added to complete the fabrication of the intermediate connector component.

At the conclusion of the differential ion milling step the substrate N2 has the three dimensional tapered transmission line 107 configuration shown in FIG. 13.

A second layer 134 of substrate material N1 is then placed on top of the lower layer 123 and the lower layer 123 of substrate material N1 and on top of the curved upper surface of the substrate material N2 to complete the fabrication of the intermediate connector 103.

The layer 129 of the substrate N2 and the upper layer 134 of the substrate N1 may be spun coated, or vapor deposited, or reacted in place, or can be pressed in as a secondary layer. There are a number of commercially available, well known techniques for applying the substrate materials N2 and N1 in the structure shown in FIGS. 7–10.

Suitable, commercially available substrate materials may be selected for the substrates N1 and N2, depending upon the specific indexes of refraction desired (or required) for the function to be performed.

The materials can be any of a number of well known and commercially available substrate materials, such as, for example, polymers, glass, semiconductor material, as well as any material that can be put down by chemical vapor deposition or physical vapor deposition processes.

The substrate materials can be any optical material that can be deposited as a controllable film. Some of the methods for depositing a controllable film are reaction from a plasma, spin coating, dipping, casting, lamination, doctor blading, chemical vapor deposition, and physical vapor deposition.

FIGS. 15–19 show details of the construction and method of fabrication of the waveguide component 105.

Figure 15:
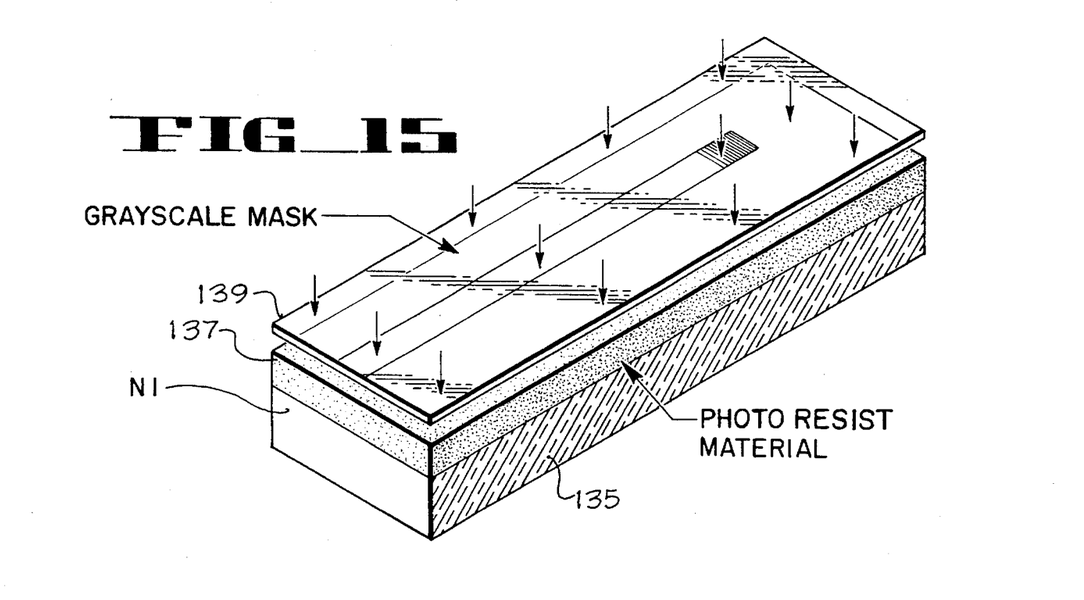

As illustrated in FIG. 15, a layer 135 of a substrate material N1 has a layer 137 of photoresist material placed on top of the substrate. A mask 139 is positioned above the layer 137 of photoresist. As noted above under the sub-title "Brief Description of the Drawing Views", a gray scale mask is required to form a flat surface only when the flat surface is not aligned along a crystal direction. The rectangular shaped waveguide 123 can be fabricated with a binary mask and ion milling, but the inclined surface for the out of plane mirror at the end of the rectangular shaped waveguide is fabricated with a gray scale mask and differential ion milling.

The mask 139 (having a gray scale in at least the portion used for the inclined, mirror, surface) is constructed to produce in the layer 137 of photoresist material a replica of the configuration of the waveguide surface 123 which is ultimately to be incorporated in the substrate N1.

As illustrated in FIG. 15, the photoresist material is illuminated through the gray scale mask 139 and is developed to provide the desired three dimensional image of the waveguide.

Figure 16:
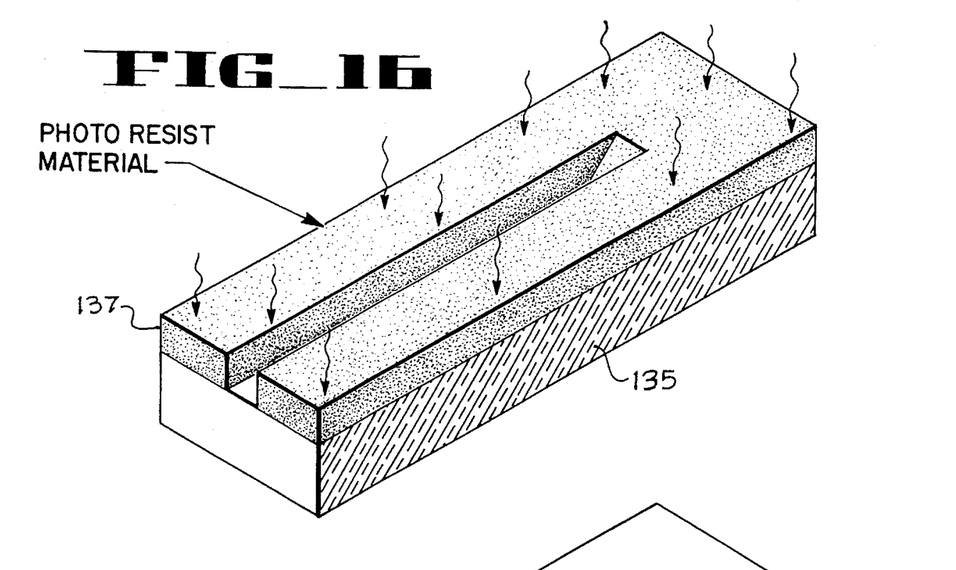

This replica image in the photoresist layer 137 is then produced in the substrate 135 by differential ion milling (as indicated by the wavy arrows in FIG. 16).

Figure 17:
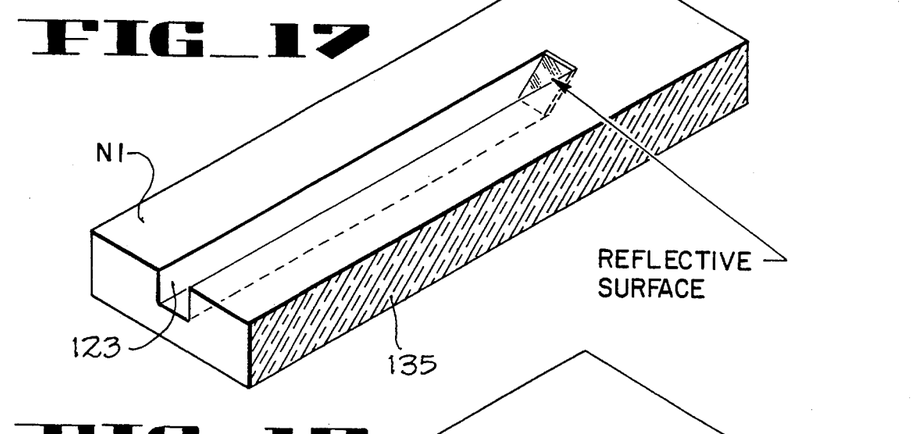
FIG. 17 shows how a reflective surface is added to inclined face at the end of the waveguide channel prior to filling the channel with a substrate N2.
Figure 18:
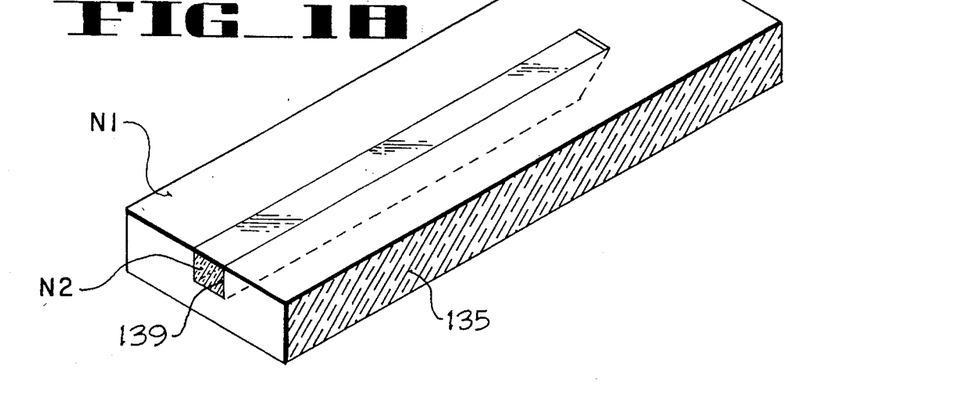
FIG. 18 shows how the second substrate material N2, having an index of refraction different from the index refraction of the substrate N1, is then added to fill in the waveguide channel in the substrate N1.

As shown in FIG. 17, a reflective surface is added to the inclined, end face of the waveguide 123. This is done before the waveguide channel 123 is filled with the layer 139 of substrate material N2.

Figures 19, 20, 21:
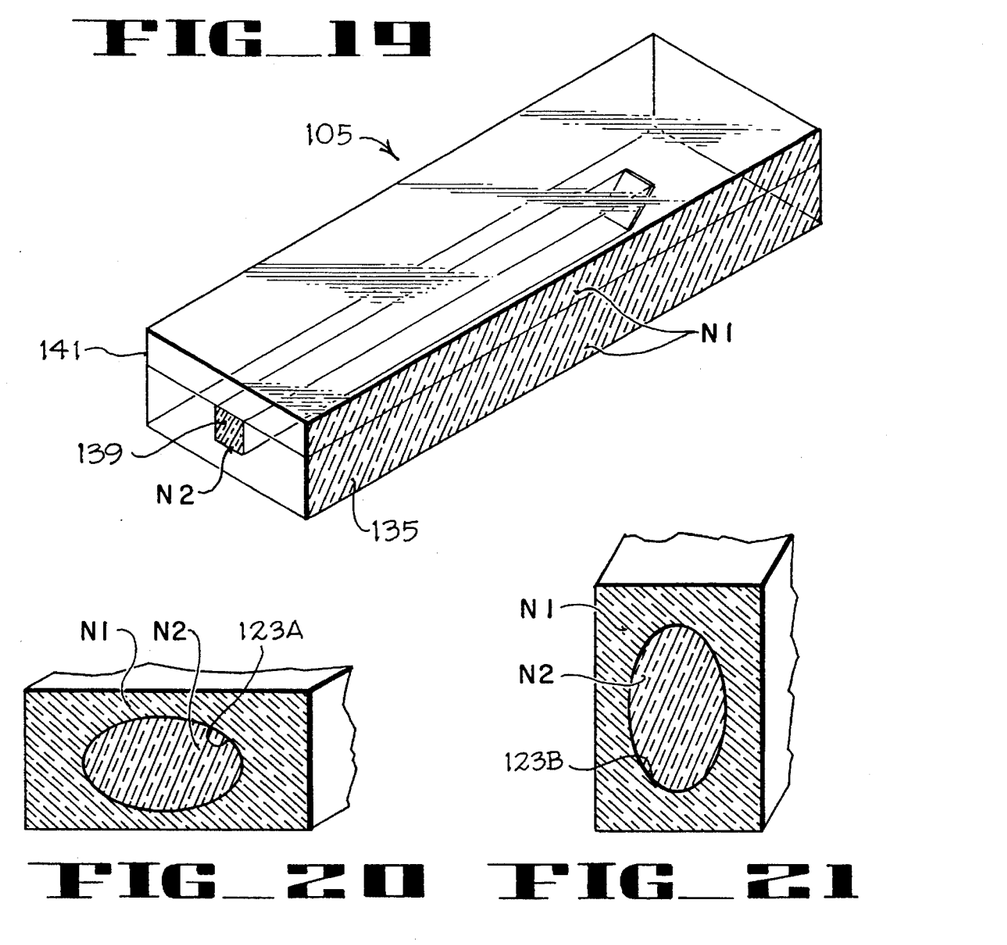
FIG. 19 shows how a second layer of substrate N1 is applied to enclose the upper surface of the substrate N2.
FIGS. 20 and 21 show how the waveguide channel containing the substrate material N2 can be formed in various curved configurations (for example, a horizontal ellipse in FIG. 20 and a vertical ellipse in FIG. 21) to accommodate selected optical modes of the optical field.

The final step in the fabrication is to add an upper, cladding layer 141 of substrate material N1 to complete the photonic component 105 shown in FIG. 19.

The waveguide channel 139 can be fabricated to have various curved configurations in cross section, if a particular curved configuration is required to accommodate selected optical modes of the optical field.

FIG. 20 shows how the waveguide channel 123A, containing the substrate material N2, can be formed to have a horizontal elliptical cross section.

FIG. 21 shows how the waveguide channel 123B can be formed to have a vertical elliptical cross section.

The reflective surface at the end of the waveguide channel (as shown in the FIG. 6 embodiment) is a planar reflective surface. But this surface can be configured to provide other optical functions.

For example, FIG. 22 shows how the reflective surface can be formed as a curved, beam focusing surface for reflecting and focusing the energy to a point outside the waveguide component 111.

FIG. 23 shows a beam splitter construction in which a partially transmissive, flat mirror is interposed in the waveguide channel (the channel filled with the substrate material N2).

The sequence of steps for fabricating the beam splitter embodiment 113 is illustrated in detail in FIGS. 24–27.

Figure 24:
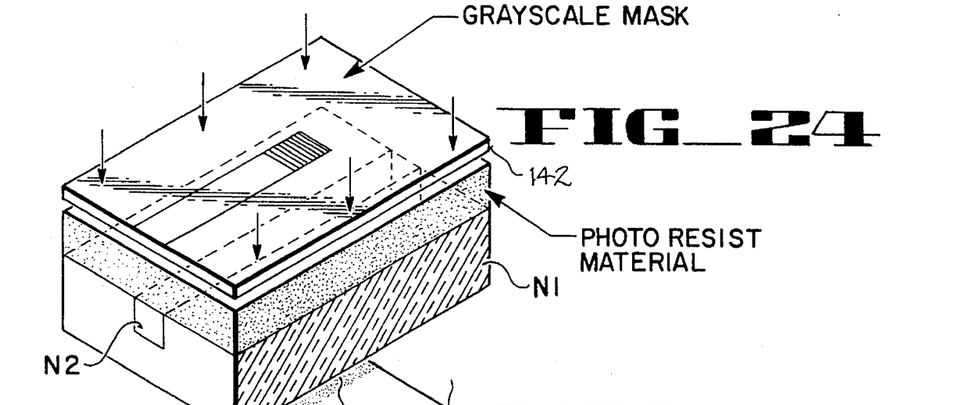
FIGS. 24–27 show progressive steps of fabrication for producing the beam splitter structure shown in FIG. 23.
Figures 25, 26:
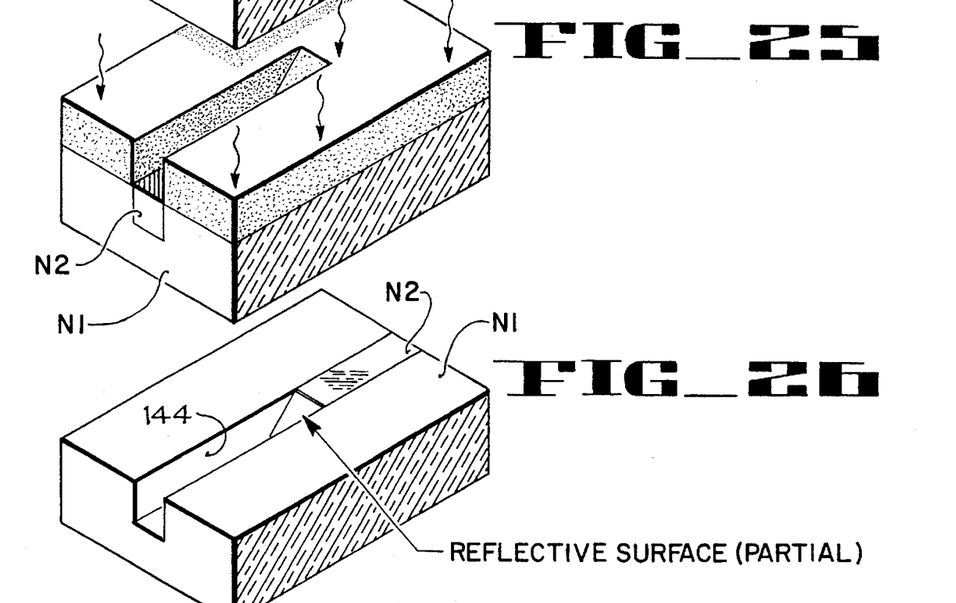

As shown in FIGS. 24 and 25 the portion of the waveguide channel on the left hand side of the beam splitter optical element is fabricated by using a separate gray scale mask 142. This gray scale mask 142 is used after a waveguide channel has been fabricated along the entire length of the substrate N1 and then filled with the substrate N2. The gray scale mask 142 is used to form the recessed channel 144 and inclined end surface shown in FIG. 26.

Figure 27:
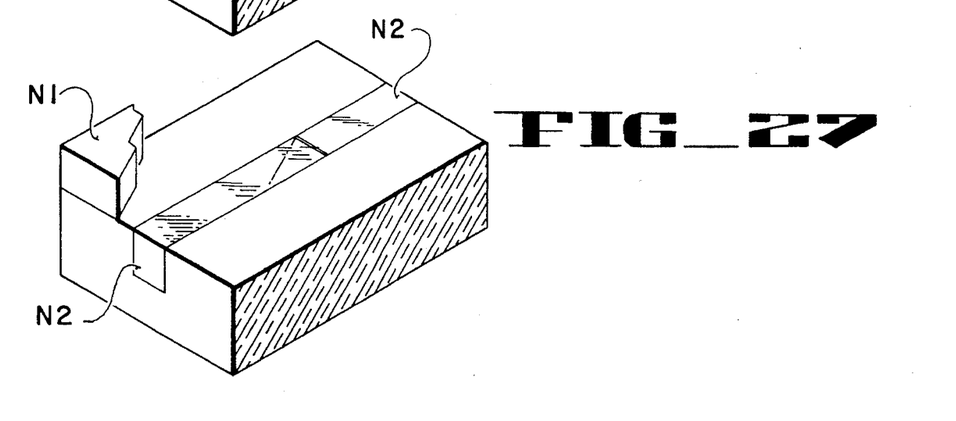

As shown in FIG. 26, a partial reflective surface is added to the inclined end surface (of the existing substrate layer N2) before the additional substrate layer N2 is filled into the waveguide channel (see FIG. 27).

The final step is to add the cladding layer of a substrate material N1 to the top of the component. Only a fragmentary portion at one corner of the upper layer of substrate N1 is shown in FIG. 27. The remainder of that layer has been broken away in order to show the structure underlying the upper layer of substrate N1.

It is an important feature of the present invention that selected substrate layers are monolithically integrated.

Certain substrate layers incorporate a specifically designed photonic waveguide surface configuration within the substrate layer.

In some embodiments of the invention the photonic waveguide surface configurations and substrate layers are aligned. See the beam splitter embodiment 133 shown in FIG. 23.

In some embodiments of the invention the photonic waveguide surface configurations and substrate layers are offset. See the embodiments 115 and 117 shown in FIGS. 28 and 29.

The photonic waveguide surface configurations and substrate layers (whether aligned or offset) may be constructed to coact with one another in the transmission of the photonic, electro-optical waves through the substrate layers.

The monolithic integration of substrate layers, which layers have specifically designed photonic waveguide surface configurations within the substrate layers, enable a single, micro fabricated and integrated optical device to provide one or more optical functions. The functions that can be performed include optical coupling, optical distributions, optical routing and splitting, optical vias and any function which is dependent on being able to control, in a three dimensional way, dielectric or optical waveguide patterns.

The embodiment 115 shown in FIG. 28 illustrates a construction which enables a control function to be performed.

In the embodiment 115 shown in FIG. 28 the upper, incoming waveguide channel 145 is formed with a lens 147 at the end of the channel; and the lower, outgoing waveguide channel 149 is formed with a lens 151 at the end of the channel.

The lenses 147 and 151 coact to transmit the photonic beam between the waveguide channels 145 and 149.

A pair of electrodes 153 and 155 are positioned adjacent the waveguide channel 149 to control the flow of energy through the waveguide channel. In one, simple, control application the electrodes are controlled to cause the substrate material N2 to become opaque to the transmission of light when the electrodes are energized and to cause the substrate material N2 to be transmissive when the electrodes are not energized.

In the embodiment 117 shown in FIG. 129, the end of the upper waveguide channel 145 is formed with a lens 157, and the end of the lower waveguide channel 149 is formed with a curved reflecting mirror 161. The lens 157 and the mirror coact to cause incoming light from the channel 145 to be transmitted as outgoing light through the waveguide channel 149.

FIGS. 30–43 are progressive views showing various stages of fabrication of the monolithically integrated substrate layers of the micro-fabricated, integrated optical device 115 illustrated in FIG. 28.

As illustrated in FIGS. 30–33, a first mask 163 is used to produce a lower waveguide channel 149 completely throughout the length of the first layer 165 of substrate N1.

Figure 33:
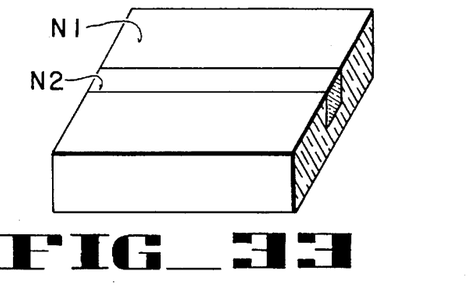
Figures 34, 35:
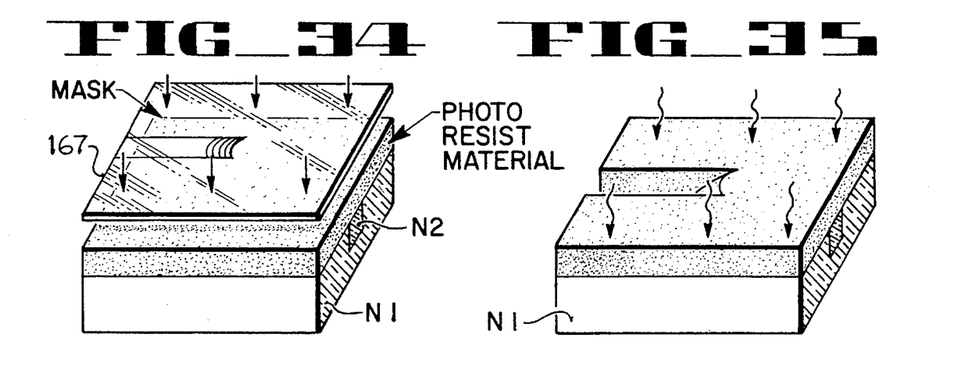
Figure 36:
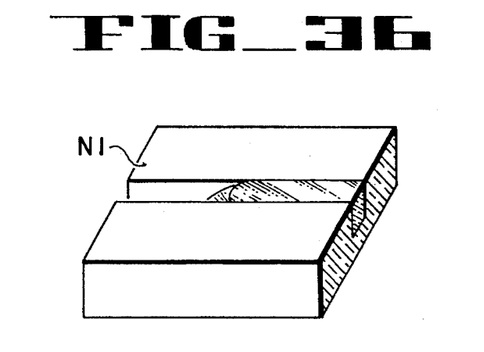

This waveguide channel 149 is then filled with substrate material N2, as shown in FIG. 33.

A second mask 167 (see FIG. 34) is then used to remove the left hand portion of the substrate material N2 and to form the curved lens surface 151 on the substrate layer N2 remaining in the channel. See FIG. 36. This portion of the channel is then filled with substrate material N1. See FIG. 37.

Figure 37:
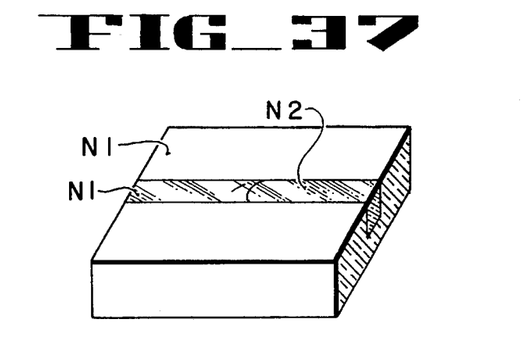
Figures 38, 39:
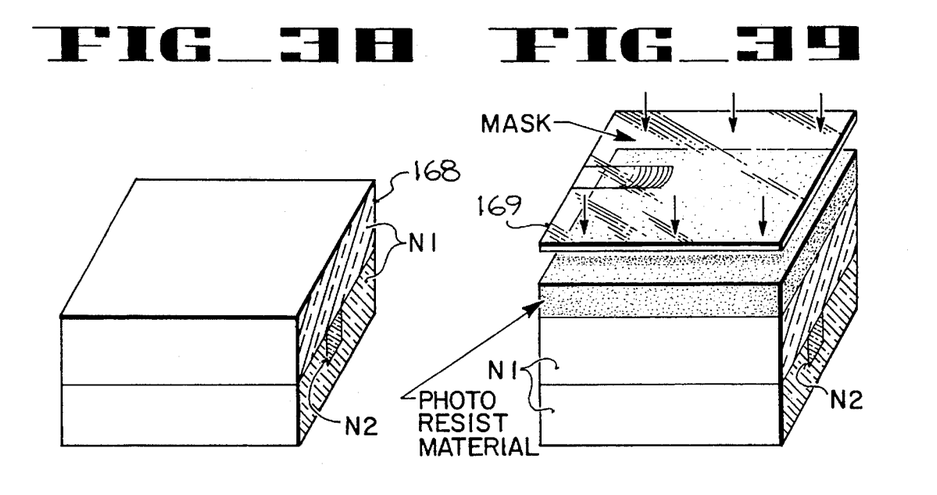
Figure 40:
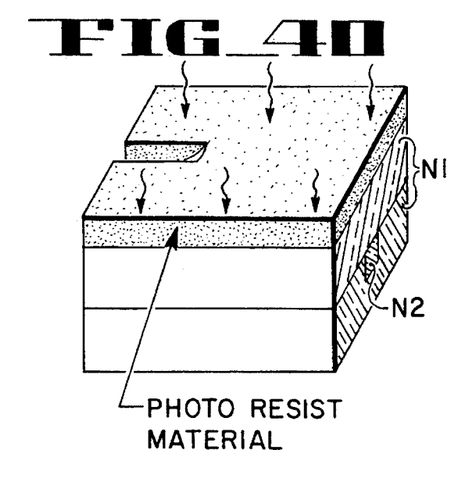
Figure 41:
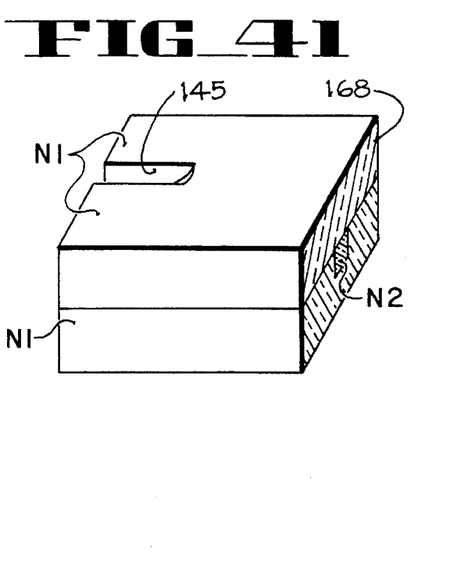
Figure 42:
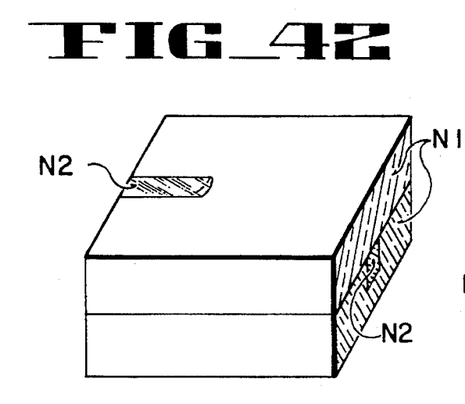

A layer of substrate material N1 then is placed on top of the FIG. 37 structure. See FIG. 38.

A third mask 169 (see FIG. 39) is then used to produce the upper waveguide channel 145 in the layer 168 of substrate material N1. See FIG. 41. This channel 145 is configured to have the lens element 147 formed at the end of the channel.

This channel 145 is then filled with a layer of substrate material N2. See FIG. 42.

Figure 43:
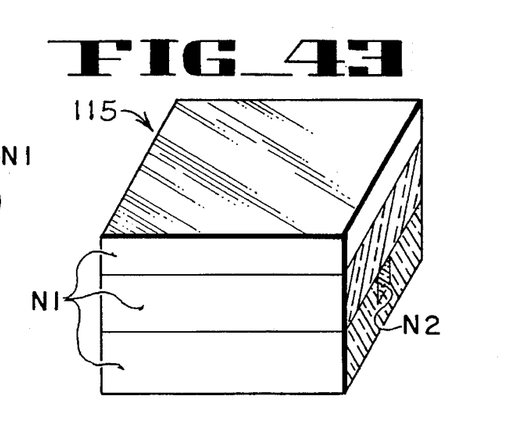

Finally, as shown in FIG. 43, an upper, cladding layer of substrate material N1 is added to complete the fabrication of the embodiment 115.

The gray scale mask fabrication process of the present invention and the monolithic integration of substrate layer of the present invention make it possible to construct surface configurations which would be difficult or impossible to construct with other fabrication processes.

The present invention also permits high volume manufacture at low cost, as compared to other fabrication processes, because each gray scale mask can be reproduced and used in staged arrays (as shown and described with reference to FIG. 14 of parent application Ser. No. 07/982,514 filed Nov. 27, 1992, now U.S. Pat. No. 5,310,623).

While we have illustrated and described the preferred embodiments of our invention, it is to be understood that these are capable of variation and modification, and we therefore do not wish to be limited to the precise details set forth, but desire to avail ourselves of such changes and alterations as fall within the purview of the following claims.

We claim:

1. A method of fabricating within a volume of a photoresist material a replica of a photonic waveguide surface of any designed curved or inclined planar configuration, using a single exposure mask, and then producing a copy of the replica directly in a substrate material as the waveguide surface for ultimate use in photonic applications, said method comprising, constructing a single exposure mask with a plurality of precisely located and sized light transmitting openings formed with sufficiently small specific opening sizes and located at a sufficiently large number of specific locations, correlated to related locations on the configuration of the designed curved or inclined planar photonic waveguide surface, to enable a replica image of the said designed surface to be produced within a volume of a photoresist material, exposing a related photoresist material to light of a selected wavelength and transmitted through said openings in said single mask for a selected duration of time, processing the exposed photoresist material to produce a replica within the photoresist material of said designed surface, which replica can be used subsequently for producing a copy of the photoresist replica of said desired surface directly within the substrate material as the waveguide surface, placing the photoresist material replica on a first substrate material having a first index of refraction.

processing the replica and the first substrate material to produce a copy of the photoresist replica of said desired surface directly within the substrate material as the waveguide surface and to remove a volume of the first substrate material which is bounded by the waveguide surface produced in the first substrate, and filling the removed volume with a second substrate material having a second index of refraction different from the first index of refraction of the first substrate material so that said waveguide surface is contained within the first substrate material at an interface between the first substrate material and the second substrate material.

2. The invention defined in claim 1 including monolithically integrating a plurality of substrate layers, with certain ones of the substrate layers incorporating a specifically designed photonic waveguide surface configuration within the substrate layer and including constructing at least two specifically designed photonic waveguide surface configurations in at least two of the substrate layers to coact with one another in the transmission of electro-optical waves through the substrate layers.

3. A method of fabricating within a volume of a photoresist material a replica of a photonic waveguide surface of any designed configuration, using a single exposure mask, and reproducing the replica directly in a substrate material for ultimate use in photonic applications, said method comprising, constructing a single exposure mask with a plurality of precisely located and sized light transmitting openings formed with sufficiently small specific opening sizes and located at a sufficiently large number of specific locations, correlated to related locations on the configuration of the designed photonic waveguide surface, to enable a replica image of the said surface to be produced within a volume of a photoresist material exposing a related photoresist material to light of a selected wavelength and transmitted through said openings in said single mask for a selected duration of time processing the exposed photoresist material to produce a replica within the photoresist material of the said surface, which replica can be used subsequently for producing said surface in a substrate material, placing the photoresist material replica on a first substrate material having a first index of refraction, processing the replica and the first substrate material to reproduce the replica directly within the substrate material and to remove a volume of the first substrate material which is bounded by the replicated surface produced in the first substrate, filling the removed volume with a second substrate material having a second index of refraction different from the first index of refraction of the first substrate material, and wherein the first substrate is disposed in a first layer, the second substrate is disposed in a second layer, and wherein the second layer includes a portion which, as initially deposited, extends above the upper surface of the first layer by an amount sufficient to enable the reverse image of said configuration of the designed photonic waveguide surface to be formed in the thickness of the second layer which extends above the first layer, and including placing a layer of photoresist material on top of the layer of the second substrate, placing a second exposure mask constructed to produce said reverse image above the second layer of photoresist, exposing the second layer of photoresist, processing the exposed photoresist material to produce a replica of said reversed image in the photoresist material, processing the replica of said first reverse image and the second layer of substrate material to produce the replica directly within the second layer of substrate material and to remove a volume of the second layer from the substrate material which is bounded by the reversed image produced in the second layer of substrate, and cladding the processed reverse image in the second substrate with a third layer of substrate material having the same composition and index of refraction as said first layer of substrate material.

4. The invention defined in claim 3 wherein the second substrate material forms a cone shape, tapered transmission line.

5. The invention defined in claim 1 wherein said waveguide surface produced in the substrate is a surface which extends transversely across a waveguide channel.

6. The invention defined in claim 5 wherein the photonic waveguide surface is an inclined planar surface disposed at an angle for use as an out of plane mirror in a photonic device.

7. The invention defined in claim 5 wherein the configuration of the designed photonic waveguide surface is a curved surface which functions as a curved mirror in a photonic device.

8. The invention defined in claim 5 wherein the configuration of the designed photonic waveguide surface is a curved surface which functions as a lens surface in a photonic device.

9. The invention defined in claim 5 wherein the configuration of the designed photonic waveguide surface is an inclined planar surface disposed at an angle for use as a beam splitter in a photonic device.

10. The invention defined in claim 1 wherein the processing to reproduce the photoresist replica in the substrate is differential ion milling.

11. A micro fabricated, monolithically integrated optical device produced by the method of claim 2.

12. A micro fabricated, monolithically integrated optical device produced by the method of claim 1.

13. A microfabricated, monolithically integrated optical device produced by the method of claim 3.

* * * * *

UNITED STATES PATENT AND TRADEMARK OFFICE
CERTIFICATE OF CORRECTION

PATENT NO.  : 5,480,764
DATED       : January 2, 1996
INVENTOR(S) : George Gal et al.

It is certified that error appears in the above-identified patent and that said Letters Patent is hereby corrected as shown below:

Column 12, line 31, "desired" should read --designed--.

Column 12, line 36, "desired" should read --designed--.

Signed and Sealed this

Twenty-sixth Day of March, 1996

Attest:

BRUCE LEHMAN

*Attesting Officer*           *Commissioner of Patents and Trademarks*